(12) United States Patent
Lu et al.

(10) Patent No.: US 7,504,318 B2
(45) Date of Patent: Mar. 17, 2009

(54) NANOPOWDER COATING FOR SCRIBING AND STRUCTURES FORMED THEREBY

(75) Inventors: Daoqiang Lu, Chandler, AZ (US); Eric J. Li, Chandler, AZ (US); Tian-An Chen, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 11/230,367

(22) Filed: Sep. 19, 2005

(65) Prior Publication Data

US 2007/0066032 A1    Mar. 22, 2007

(51) Int. Cl.
*H01L 21/46* (2006.01)
(52) U.S. Cl. ............... 438/462; 438/114; 438/465
(58) Field of Classification Search ......... 438/462, 438/460, 758, 759, 113, 114, 463, 464, 465
See application file for complete search history.

(56) References Cited

U.S. PATENT DOCUMENTS

| 6,225,191 | B1 * | 5/2001 | Ahlquist et al. ............. 438/460 |
| 6,558,975 | B2 * | 5/2003 | Sugino et al. ................ 438/64 |
| 6,974,726 | B2 * | 12/2005 | Dani et al. ................... 438/114 |
| 7,179,723 | B2 * | 2/2007 | Genda et al. ................ 438/462 |
| 2002/0001773 | A1 * | 1/2002 | Saito et al. ............... 430/270.1 |
| 2006/0166014 | A1 * | 7/2006 | Klotz et al. ................ 428/469 |

OTHER PUBLICATIONS

Li et al.: Poly(vinyl alcohol) nanoparticles prepared by freezing-thawnig process for protein / peptide drug delivery; Journal of Controlled Release vol. 56, 1998, pp. 117-126.

* cited by examiner

*Primary Examiner*—Kevin M Picardat
(74) *Attorney, Agent, or Firm*—Kathy J. Ortiz

(57) ABSTRACT

Methods of forming a microelectronic structure are described. Embodiments of those methods include forming a conformal layer of a water soluble nanopowder on a wafer, and then scribing the wafer.

24 Claims, 5 Drawing Sheets

NANOPOWDER COATING FOR SCRIBING AND STRUCTURES FORMED THEREBY

BACKGROUND OF THE INVENTION

Microelectronic device surfaces, such as wafer surfaces, for example, may be coated for protection during scribing processes. Such coating may prove difficult when conformal surface coverage is desired, wherein thickness variations may be encountered due to topology effects.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
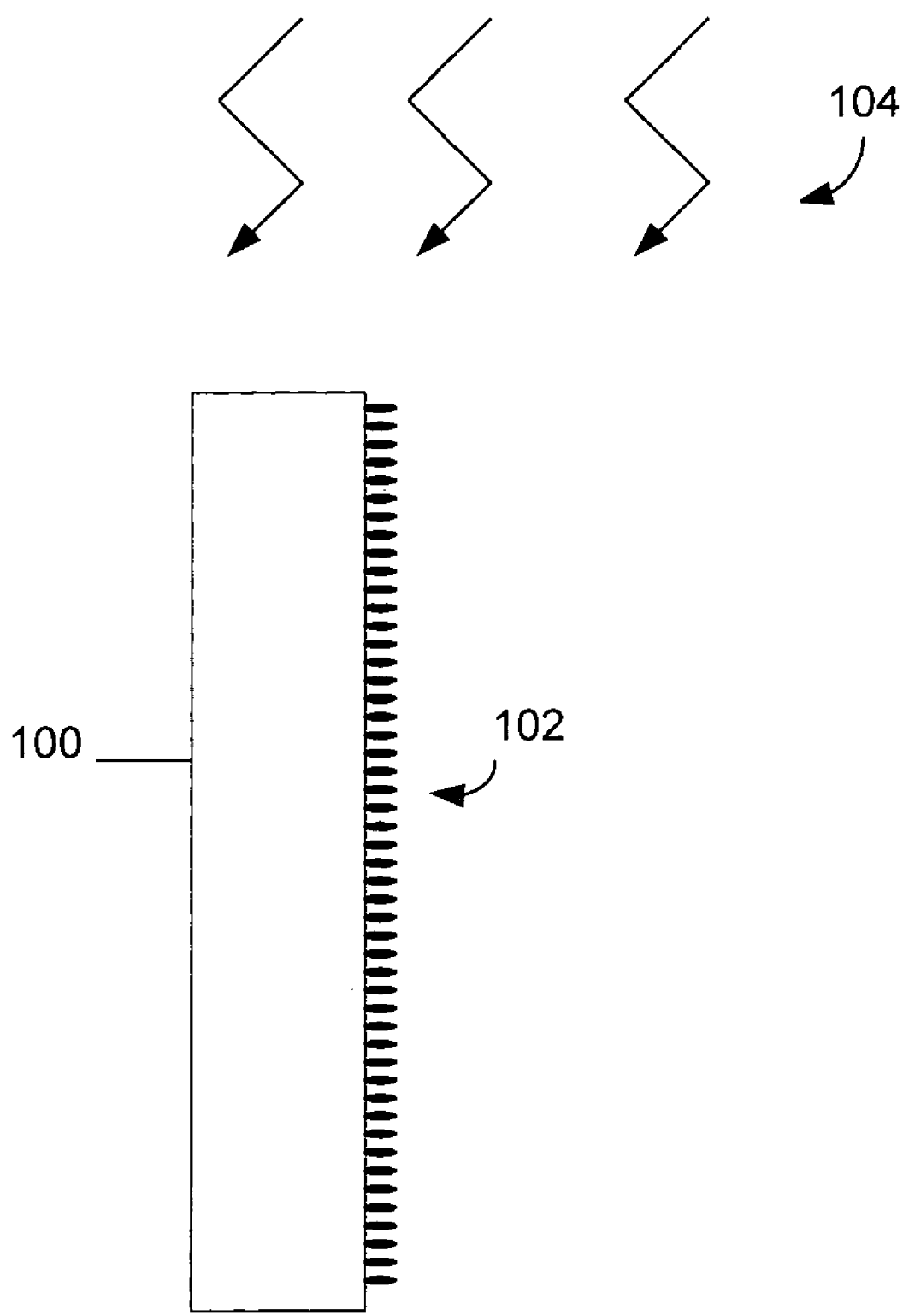
FIGS. 1a-1f represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure, such as a coated wafer structure, are described. Those methods may comprise forming a conformal layer of a water soluble nanopowder on a wafer, and then scribing the wafer.

FIGS. 1a-1f illustrate an embodiment of a method of forming a microelectronic structure, such as a coated wafer structure, for example. FIG. 1a illustrates a wafer 100. In one embodiment, the wafer may comprise at least one feature 102, such as but not limited to a transistor, resistor, inductor, capacitor, a dielectric layer and interconnection structures, such as bonding pads and/or bumps, for example. In one embodiment, the wafer 100 may be any such substrate that may be associated with a microelectronic device. It will be understood by those skilled in the art that the wafer 100 may comprise a portion of a wafer, such as an individual die.

In one embodiment, the wafer 100 may comprise many stacked layers of materials, such as but not limited to a layered stack wherein a polyimide layer may be disposed on a layer of metallization that may be disposed on a layer of oxide, such as a low k dielectric layer, as is well known in the art. In one embodiment, the wafer 100 may comprise a significant depth profile, wherein the wafer 100 may exhibit a significant amount of topography due to various surface features and/or film layers that may be present.

Figure 1B:
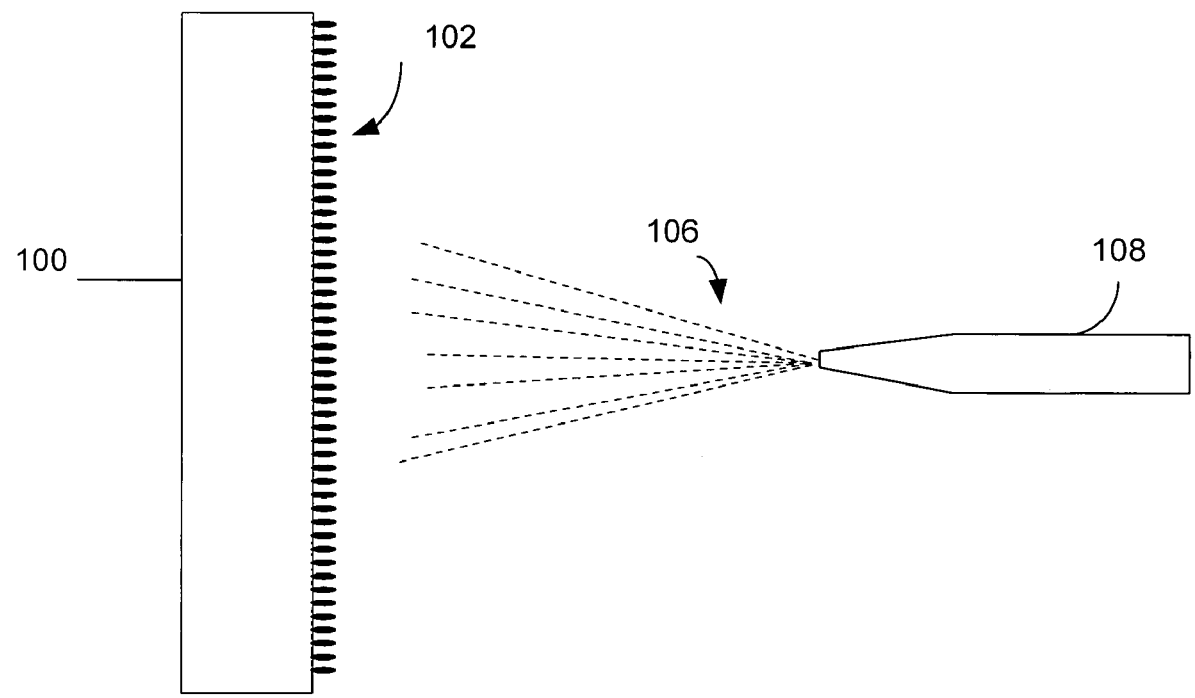
Figure 1C:
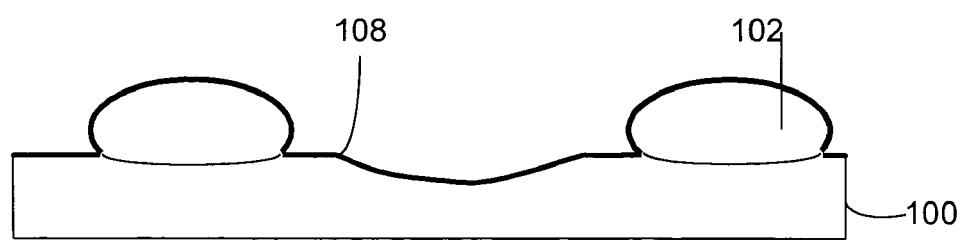
Figure 1D:
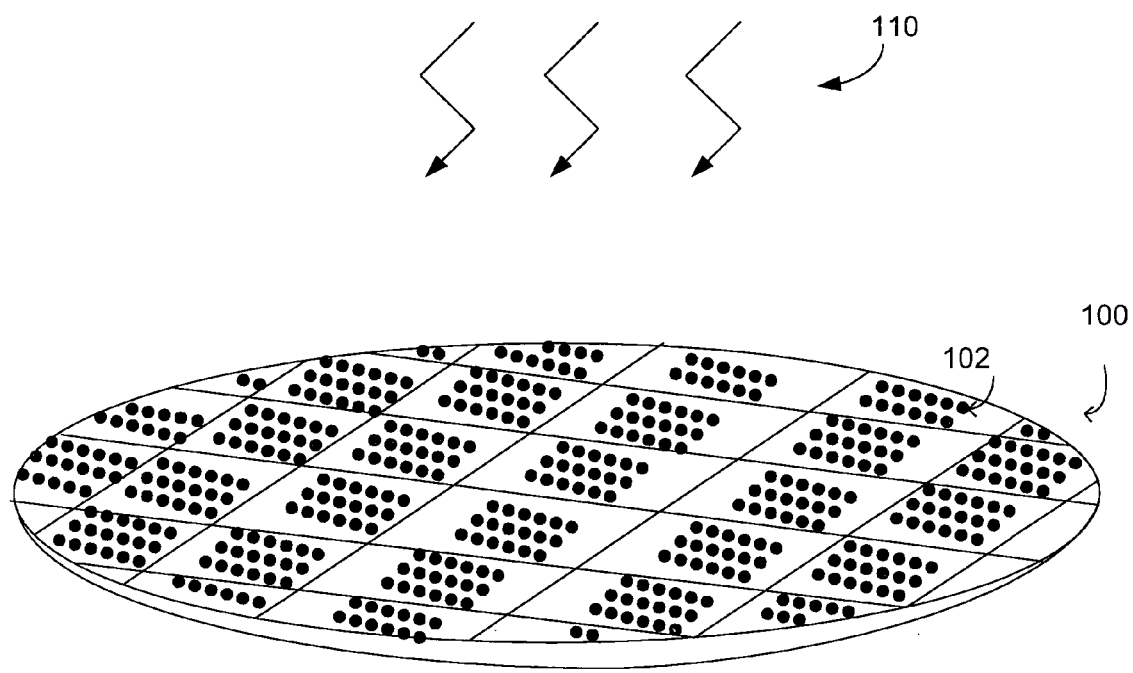

In one embodiment, the wafer may be pre-heated by applying an amount of heat 104 to the wafer 100. The amount of heat and desired temperature to be applied to the wafer 100 will depend upon the particular application. A water soluble nanopowder 106 may be sprayed onto the wafer 100, by utilizing a spraying apparatus 109, such as a spray nozzle, as are well known in the art (FIG. 1b). In one embodiment, the spraying apparatus 109 may spray the water soluble nanopowder 106 onto the wafer 100 by utilizing a high pressure.

In one embodiment, the water soluble nanopowder 106 may comprise water soluble nanoparticles. In one embodiment, the water soluble nanoparticles may comprise a dry powder wherein the individual water soluble nanoparticles that comprise the dry powder may comprise a diameter between about 50 nanometers to about 100 microns. In one embodiment, the water soluble nanopowder 106 may comprise at least one of polyvinyl alcohol, polyacrylic acid, polyacrylamide, water soluble starch and water soluble cellulose. In one embodiment, wherein the water soluble nanopowder 106 may comprise polyacrylamide, the wafer 100 may be pre-heated to a temperature of about 84 degrees Celsius, wherein the polyacrylamide may soften and/or melt to form a conformal layer onto the wafer 100. In some embodiments, the water soluble nanopowder 106 may comprise a material that softens and/or melts below about 400 degrees Celsius.

In one embodiment, a conformal layer 108 may be formed and/or placed and/or sprayed on a surface of the wafer 100 (FIG. 1c), wherein the conformal layer 108 may comprise the water soluble nanopowder 106. The conformal layer 108 may also be formed on the at least one feature 102. In one embodiment, the conformal layer 108 may comprise a thickness between about 50 nm and about 10 microns.

In general, the conformal layer 108 may exhibit minimal height variations, i.e., in one embodiment the thickness uniformity of the conformal layer may be less than about 5 percent across a substrate, such as the wafer 100. The conformal layer 108 may exhibit minimal thickness variation and good conformal coverage substantially independent of the surface geometries and depth variations that may be present on a particular substrate.

Figure 1E:
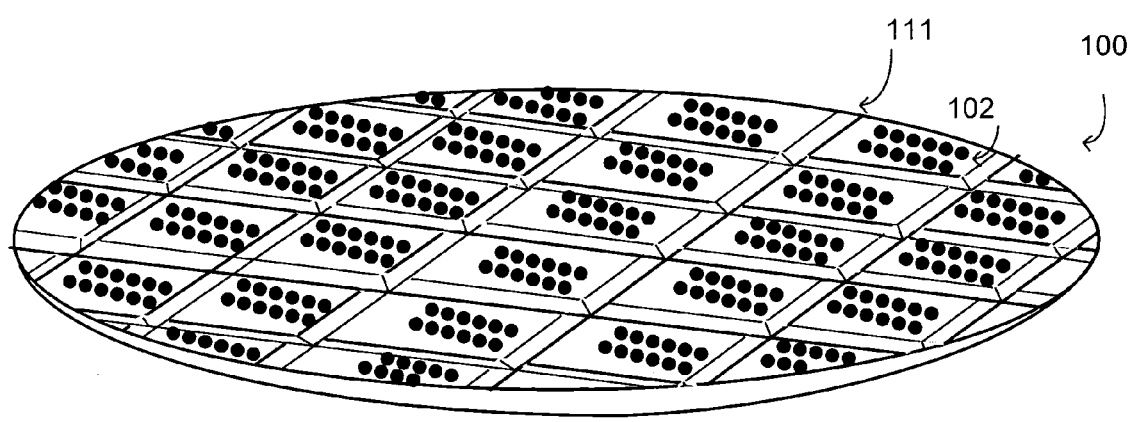

In one embodiment, the wafer 100 comprising the conformal layer 108 (not shown) may be scribed (FIG. 1d), wherein the individual die that comprise the wafer may be demarcated from each other (FIG. 1e). In one embodiment, the wafer 100 may be scribed by utilizing a laser scribing process 110 (refer back to FIG. 1d) as is well known in the art. Laser scribing may be used to create at least one groove 111 or other surface discontinuity along a line which may be subsequently sawed or broken to complete the separation of individual die from each other.

The presence of the conformal layer 108 on the surface of the wafer 100 and on the surface of the at least one feature 102 may serve to protect the wafer 100 and the at least one feature 102 from debris that may be generated during the laser scribing process 110. In one embodiment, such debris may be deposited on the conformal layer 108 rather than directly on the wafer 100 and the feature 102 surfaces and may be washed away in a later stage.

In one embodiment, the presence of the conformal layer 108 on the surface of the wafer 100 and on the surface of the at least one feature 102 may also substantially eliminate refraction, diffraction, and scattering effects (such as de-focusing of the laser energy, laser beam steering, and extra energy loss), which may occur during a laser scribing process utilizing a nonconformal protective layer.

Thus, the presence of the conformal layer 108 may result in significantly improved repeatability and throughput of the scribing process 110. Because the conformal layer 108 may be formed in a substantially uniform manner on a substrate, such as the wafer 100, independent of the type and severity of the topography of the particular substrate, the scribing process 110 parameters may not need to be substantially changed for substrates that may exhibit differing degrees of topography.

Figure 1F:
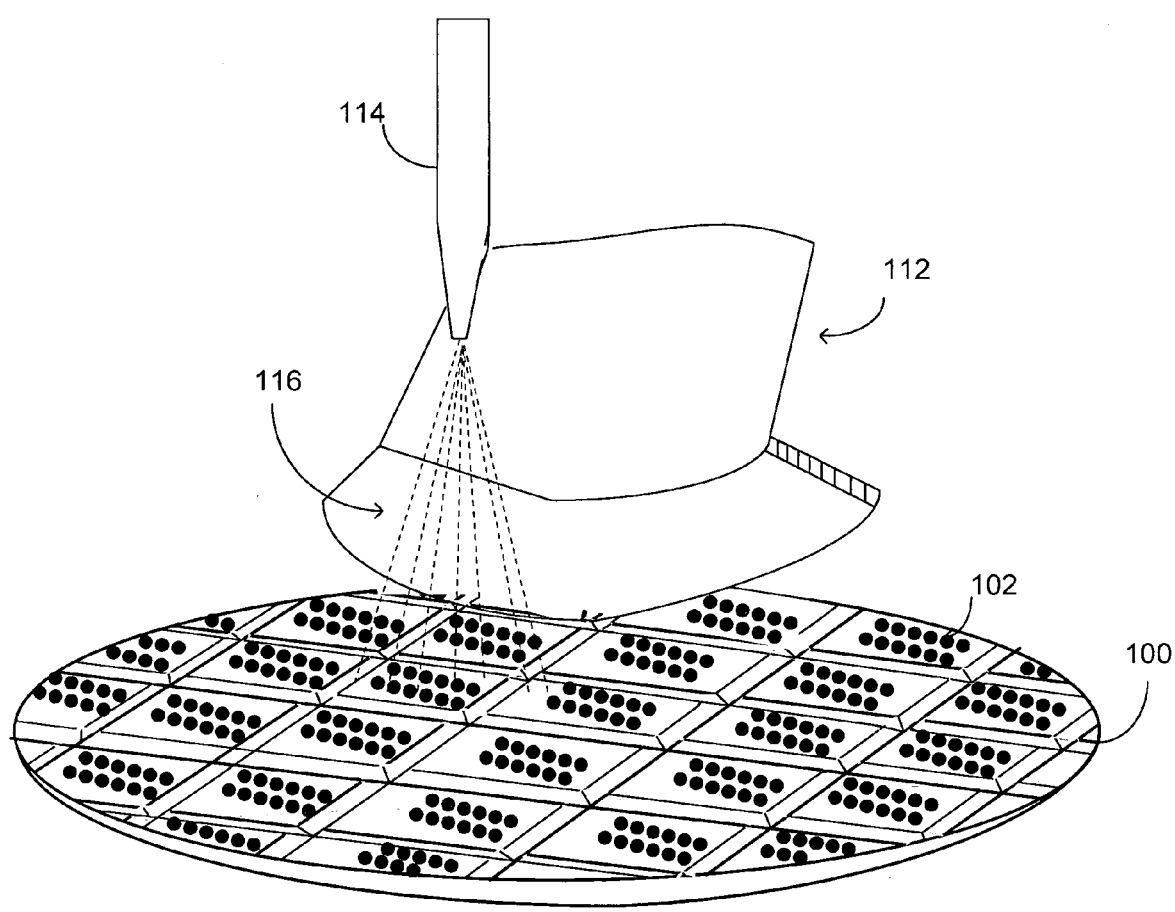

The individual die of the wafer 100 may be physically separated from each other by utilizing any type of saw process utilizing a saw blade 112, as are well known in the art (FIG. 1*f*). The saw process may include one or more nozzles 114 that may provide a spray or stream of fluid 116 during the sawing operation. The fluid 116 may comprise a solvent for the conformal layer 108, such as an aqueous solution. In some embodiments, the action of the fluid 116 may substantially wash away the conformal layer 108 along with any laser scribing debris that may be present in the areas adjacent to the fluid 116 flow. In other embodiments, the conformal layer 108 may remain on portions of the surface of the wafer 100 and on the at least one feature 102.

Figure 2:
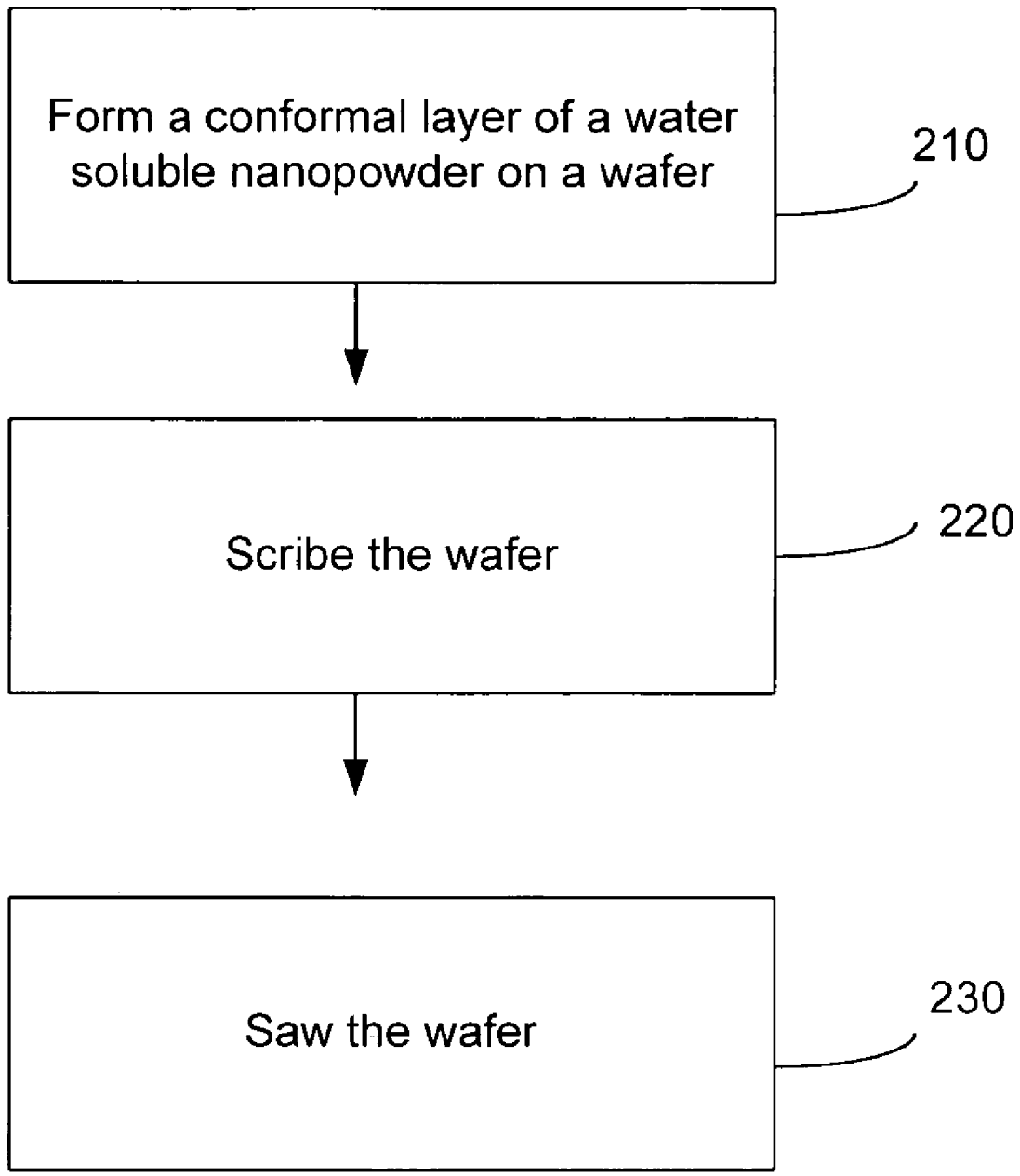
FIG. 2 represents a flow chart according to an embodiment of the present invention.

FIG. 2 is a flow chart illustrating a method according to an embodiment of the present invention. The method includes forming a conformal layer of a water soluble nanopowder on a wafer 210, scribing the wafer 220, and then sawing the wafer 230. The wafer may be washed with solvent that washes away all or substantially all of the conformal layer along with any laser scribing debris. The step of sawing the wafer may be performed under a flow of solvent sufficient to remove at least a substantial portion of the conformal layer. If the conformal layer separate is not removed as part of a saw cutting operation, the wafer may be washed with a solvent as part of a separate operation. In one embodiment, the solvent washing may also precede the sawing. The water may be at room temperature or may be heated.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures are well known in the art. Therefore, the Figures provided herein illustrate only portions of an exemplary microelectronic structure that pertains to the practice of the present invention. Thus the present invention is not limited to the structures described herein.

What is claimed is:

1. A method comprising;
   forming a conformal layer of a water soluble nanopowder on a wafer by pre-heating the wafer to a temperature substantially near the melting temperature of the water soluble nanopowder and then applying the water soluble nanopowder to the wafer, and
   scribing the wafer, wherein the conformal layer remains on the wafer.

2. The method of claim 1 wherein applying the water soluble nanopowder comprises spraying the water soluble nanopowder under high pressure.

3. The method of claim 1 further comprising wherein pre-heating the wafer to a temperature substantially near the melting temperature of the water soluble nanopowder achieves a thickness uniformity of the conformal layer below about 5 percent.

4. The method of claim 1 wherein the water soluble nanopowder comprises at least one of polyvinyl alcohol, polyacrylic acid, polyacrylamide, water soluble starch and water soluble cellulose.

5. The method of claim 1 wherein the water soluble nanopowder comprises water soluble nanoparticles.

6. The method of claim 5 wherein the water soluble nanoparticles comprise a diameter of less than about 10 microns.

7. The method of claim 1 wherein the wafer comprises at least one of a metal layer, a scribe line, a dielectric layer, a polyimide layer.

8. The method of claim 1 wherein scribing the wafer comprises laserscribing the wafer.

9. The method of claim 1 wherein the water soluble nanopowder comprises a dry powder.

10. The method of claim 1 wherein the water soluble nanopowder comprises a dry powder that softens below about 400 degrees.

11. The method of claim 1 wherein the conformal layer comprises a thickness between about 50 nm and about 10 microns.

12. A method comprising:
    forming a conformal layer of a water soluble nanopowder on a wafer by pre-heating the wafer to a temperature substantially near the melting temperature of the water soluble nanopowder and then applying the water soluble nanorpowder to the wafer;
    scribing the wafer; and
    sawing the wafer.

13. The method of claim 12 wherein sawing the wafer further comprises applying a spray rinse.

14. The method of claim 12 wherein the water soluble nanopowder comprises at least one of polyvinyl alcohol, polyacrylic acid, polyacrylamide, water soluble starch and water soluble cellulose.

15. The method of claim 12 scribing the wafer comprises laser scribing the wafer along scribe lines.

16. The method of claim 12 wherein sawing the wafer comprises sawing the wafer while the wafer is exposed to a flow of water.

17. A structure comprising:
    a wafer comprising at least one of a transistor, resistor, inductor, capacitor, a dielectric layer and interconnection structures, wherein the wafer comprises a temperature; and
    a conformal layer of a water soluble nanopowder disposed on the surface of the wafer, wherein the temperature of the wafer is substantially near a melting temperature of the water soluble nanopowder.

18. The structure of claim 17 wherein the water soluble nanopowder comprises at least one of polyvinyl alcohol, polyacrylic acid, polyacrylamide, water soluble starch and water soluble cellulose.

19. The structure of claim 17 wherein the water soluble nanopowder comprises water soluble nanoparticles.

20. The structure of claim 19 wherein the water soluble nanoparticles comprise a diameter of less than about 10 microns.

21. The structure of claim 19 wherein the water soluble nanoparticles comprises a dry powder.

22. The structure of claim 17 wherein the conformal layer is between about 50 nm and about 10 microns in thickness, and comprises a thickness uniformity of less than about 5 percent.

23. The structure of claim 17 wherein the water soluble nanopowder comprises a dry powder that melts below about 400 degrees.

24. The structure of claim 17 wherein the wafer further comprises individual die.

* * * * *